(12) United States Patent
Sakurai

(10) Patent No.: US 6,437,541 B1
(45) Date of Patent: Aug. 20, 2002

(54) BATTERY STATE MONITORING CIRCUIT AND BATTERY DEVICE

(75) Inventor: Atsushi Sakurai, Chiba (JP)

(73) Assignee: Seiko Instruments Inc., Tokyo (JP)

( * ) Notice: Subject to any disclaimer, the term of this patent is extended or adjusted under 35 U.S.C. 154(b) by 0 days.

(21) Appl. No.: 10/037,645

(22) Filed: Jan. 3, 2002

(30) Foreign Application Priority Data

Jan. 5, 2001 (JP) ......................................... 2001-000496

(51) Int. Cl.[7] .................................................. H02J 7/14
(52) U.S. Cl. ........................................ 320/134; 320/155
(58) Field of Search .................................. 320/134, 136, 320/157, 158, 159, 155

(56) References Cited

U.S. PATENT DOCUMENTS 5,764,035 A * 6/1998 Lee .............................. 320/160
6,239,581 B1 * 5/2001 Yoshida ....................... 320/162

FOREIGN PATENT DOCUMENTS

JP 04075430 A * 3/1992 ............. H02H/7/18

* cited by examiner

*Primary Examiner*—Gregory Toatley
(74) *Attorney, Agent, or Firm*—Brinks Hofer Gilson & Lione

(57) ABSTRACT

A battery state monitoring circuit in a battery device has a structure such that both of a detection delay when the battery device enters the respective protective states of over-charge, over-discharge and over-current, and a release delay when the battery device is released from the respective protective states are ensured.

12 Claims, 6 Drawing Sheets

US 6,437,541 B1

BATTERY STATE MONITORING CIRCUIT AND BATTERY DEVICE

BACKGROUND OF THE INVENTION

1. Field of the Invention

The present invention relates to a battery state monitoring circuit which is capable of controlling the charging/discharging operation of a secondary battery, and a battery device using that circuit.

2. Description of the Related Art

A conventional battery device formed of a secondary battery is shown in a circuit block diagram of FIG. 2. For example, Japanese Patent Application Laid-open No. Hei 4-75430 discloses the structure of the power supply device shown in FIG. 2. In the structure, a secondary battery 201 is connected, to an external terminal −V0 205 or +V0 204 through a switch circuit 203 that limits the current, i.e. the switch circuit 203 acts as a current limiter. Also, a battery state monitoring circuit 202 is connected in parallel with the secondary battery 201. The battery state monitoring circuit 202 detects the voltage and current of the secondary battery 201. In any of: an over-charge state in which the secondary battery 201 has a voltage value higher than one voltage, an over-discharge state in which the secondary battery 201 has a voltage value lower than another voltage, and an over-current state in which the current flowing in the switch circuit 203 exceeds that of a given current value with the result that an external terminal −V0 205 reaches a certain voltage, a charge/discharge inhibit signal is outputted from the battery state monitoring circuit 202 so that the switch circuit 203 turns off so as to suspend a charge current or a discharge current. Hereinafter, the states where the secondary battery 201 is in the over-charge state, in the over-discharge state or in the over-current state to stop the charging operation or the discharging operation are respectively called over-charge protective state, over-discharge protective state, or over-current protective state.

Further, another conventional example of a battery device having the battery state monitoring circuit is shown in a circuit block diagram of FIG. 3. Referring to FIG. 3, an over-charge detecting circuit 306, an over-discharge detecting circuit 307, an over-current detecting circuit 308, delay circuits 309, 310, 311, and a logic circuit 305 are combined together into a battery state monitoring circuit 202. In FIG. 3, a charger 301 is connected between external terminals +V0 204 and −V0 205, and when the voltage in the secondary battery 201 becomes equal to or more than an upper limit of a charging voltage, an over-charge detection signal is outputted to the delay circuit 309 from the over-charge detecting circuit 306, and when the over-charge detection signal continues for a given period of time or longer, the over-charge detection signal is outputted to the logic circuit 305 from the delay circuit 309. Also, a load 302 is connected between the external terminals +V0 204 and −V0 205. When, the secondary battery 201 becomes equal to or less than a lower limit of a discharging voltage, an over-discharge detection signal is output to the delay circuit 310 from the over-discharge detecting circuit 307, and when the over-discharge detection signal continues for a given period of time or longer, the over-discharge detection signal is output to the logic circuit 305 from the delay circuit 310. Also, when a discharge current that flows in the switch circuit 203 becomes equal to or more than an upper limit and the potential of the external terminal −V0 205 becomes equal to or more than a given value, the over-current detection signal is outputted to the delay circuit 311 from the over-current detecting circuit 308, and when the over-current detection signal continues for a given period of time or longer, the over-current detection signal is outputted to the logic circuit 305 from the delay circuit 311. Upon inputting the over-charge detection signal, the logic circuit 305 outputs a charge inhibition signal to an FET-B 304, thereby being capable of suspending the charge current. Also, upon inputting the over-discharge detection signal or the over-current detection signal, the logic circuit 305 outputs the discharge inhibition signal to an FET-A 303, thereby being capable of suspending the discharge current.

In the conventional power supply device structured as shown in FIG. 3, it is possible to ensure a delay time until the charge current or the discharge current stops, that is, an over-charge detection delay time, an over-discharge detection delay time and an over-current detection delay time. Those delay times are required to prevent the malfunction caused by a temporal noise or the like.

However, the conventional power supply device structured as shown in FIG. 3 cannot ensure a delay time for returning the stopped charge current or discharge current, that is, an over-charge release delay time, an over-discharge release delay time and an over-current release delay time. For that reason, there arise the following problems.

For example, in the conventional battery device, a drawback arises when a pulse discharge occurs while charging, as shown in a timing chart of FIG. 9. First, a pulsed discharge current flows. When a voltage drop occurs in an internal impedance of the secondary battery 201 and the supply voltage becomes lower than the over-charge voltage temporarily, an over-charge protective state is instantaneously released. As a result, the charge current flows for the over-charge detection delay time. The above operation is repeated in accordance with the pulse. Therefore, a problem arises such that even if the voltage of the secondary battery 201 rises to the over-charge voltage or more, the battery state monitoring circuit cannot maintain the over-charger protective state at a given voltage, and the charging operation continues in a pulsed fashion.

Also, the conventional battery device suffers from a drawback immediately when the battery device is in the over-discharge protective state as shown in a timing chart shown in FIG. 11. First, the discharge current stops as soon as the over-discharge protective state is entered. Then, the battery voltage temporarily rises due to the parasitic coil component of the secondary battery 201 or the like and exceeds the over-discharge voltage. Then, the over-discharge protective state is released instantaneously. As a result, the discharge current is allowed to flow for the over-discharge detection delay time. The above operation is repeated in accordance with the over-discharge detection delay time, and oscillation occurs. Therefore, even if the voltage of the secondary battery 201 drops, the battery state monitoring circuit cannot maintain the over-discharge protective state at a given voltage, resulting in continuation of the discharge operation. The inability to maintain the over-discharge protective state adversely affects the battery lifetime, and thus the lifetime is short in the battery device using the conventional battery state monitoring circuit.

In addition, in the conventional battery device, because the voltage of −V0 205 temporarily drops due to the coil component of an external load and so on, when the discharge current stops as soon as the over-current protective state is entered, the over-current protective state is caused to be immediately released. The operation principle is the same as that in the drawback of the over-discharge state.

Accordingly, even if a large current flows in the switch circuit 203, the battery state monitoring circuit cannot maintain the over-current protective state at a given current, resulting in continuation of the discharge operation. The inability to maintain the over-discharge protective state also adversely affects the lifetime of the switch circuit, causing the lifetime to be short in the battery device using the conventional battery state monitoring circuit.

SUMMARY OF THE INVENTION

The present invention solves the above problems with the conventional battery device, and therefore an object of the present invention is to realize a battery state monitoring circuit which is capable of surely maintaining an over-charge protective state, an over-discharge protective state and an over-current protective state and to provide a battery device which is safe and has a long lifetime.

In order to achieve the above object, according to the present invention, there is provided a battery state monitoring circuit having a circuit that is capable of ensuring an over-charge release delay time, an over-discharge release delay time and an over-current release delay time.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of preferred embodiments of the present invention with reference to the accompanying drawings.

Figure 1:
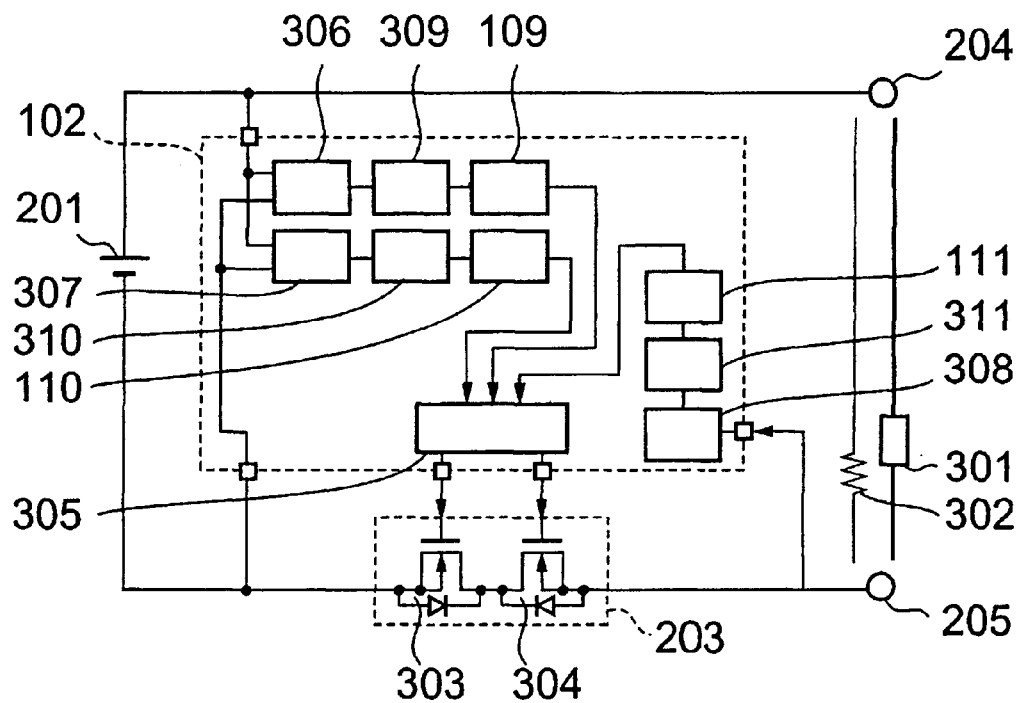
FIG. 1 is a circuit block diagram showing a battery state monitoring circuit and a battery device in accordance with an embodiment of the present invention.
Figure 2:
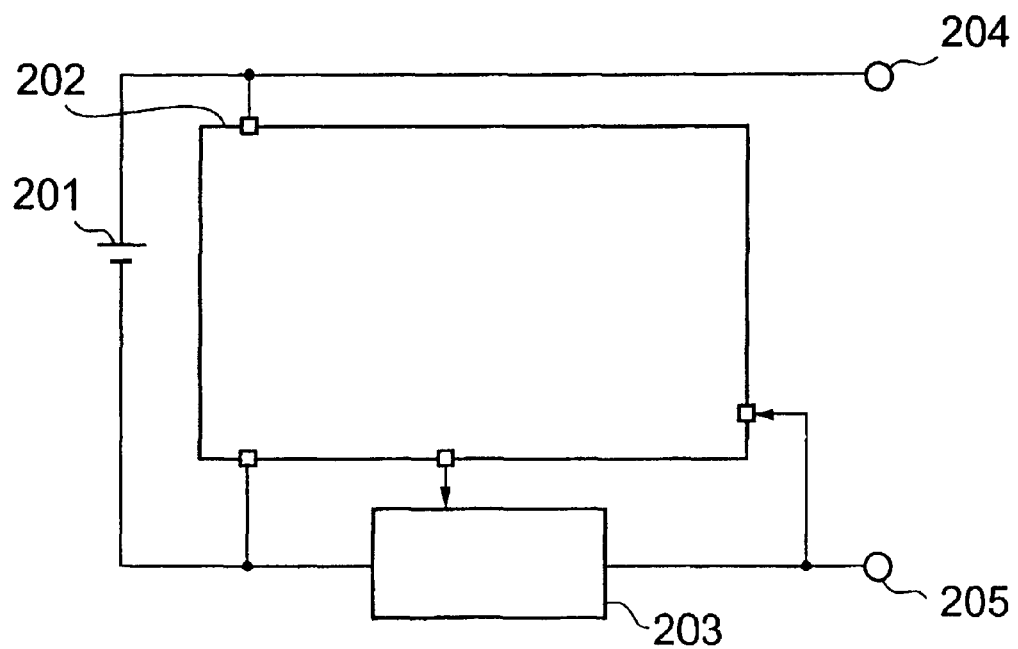
FIG. 2 is a circuit block diagram showing a battery state monitoring circuit and a battery device in accordance with an example of the prior art.
Figure 3:
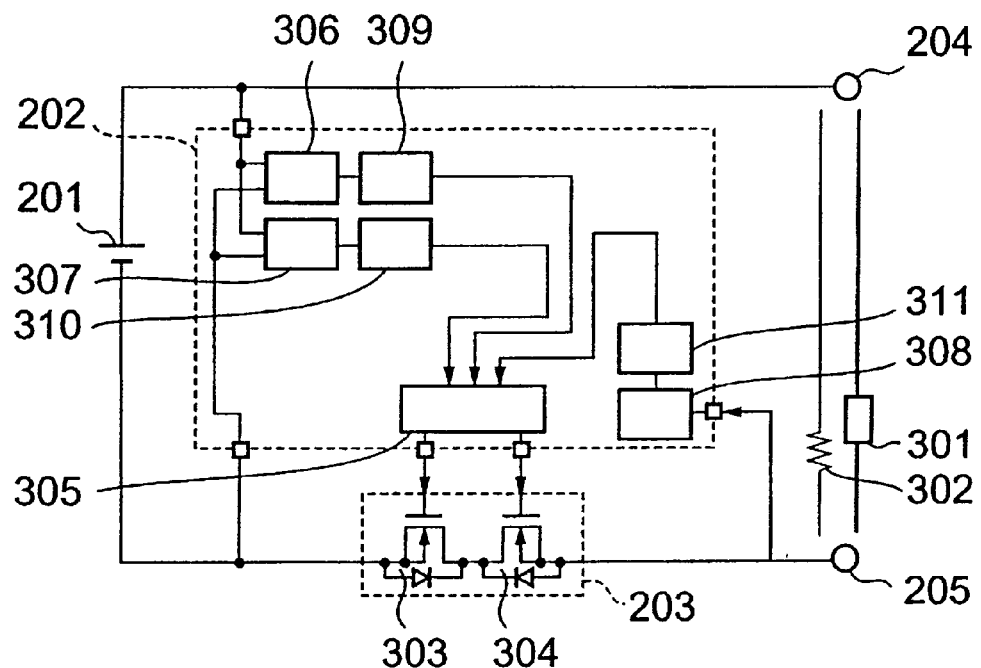
FIG. 3 is a circuit block diagram showing a battery state monitoring circuit and a battery device in accordance with another example of the prior art.

FIG. 1 is a circuit block diagram showing a battery state monitoring circuit and a battery device in accordance with an embodiment of the present invention. In FIG. 1, release delay circuits 109 and 110 have been added to the battery state monitoring circuit shown in FIG. 3 to constitute a battery state monitoring circuit 102.

In the battery state monitoring circuit and the battery device shown in FIG. 1, when a load 302 is connected between the external -terminals +V0 204 and −V 205 of the battery device which is in an over-charge protective state and a secondary battery 201 is not greater than an upper limit value of a charge voltage, an over-charge release signal is outputted to a delay circuit 309 from an overcharge detecting circuit 306. Because the delay circuit 309 is a delay circuit of an over-charge detection signal as in the conventional example, the over-charge release signal is outputted to the delay circuit 109 without any delay. The delay circuit 109 outputs the over-charge release signal to a logic circuit 305 when the over-charge release signal continues for a given period of time. If the over-charge release signal is inputted to the logic circuit 305, the logic circuit 305 outputs a charge enable signal to an FET-B 304 to enable the charging operation.

Figure 10:
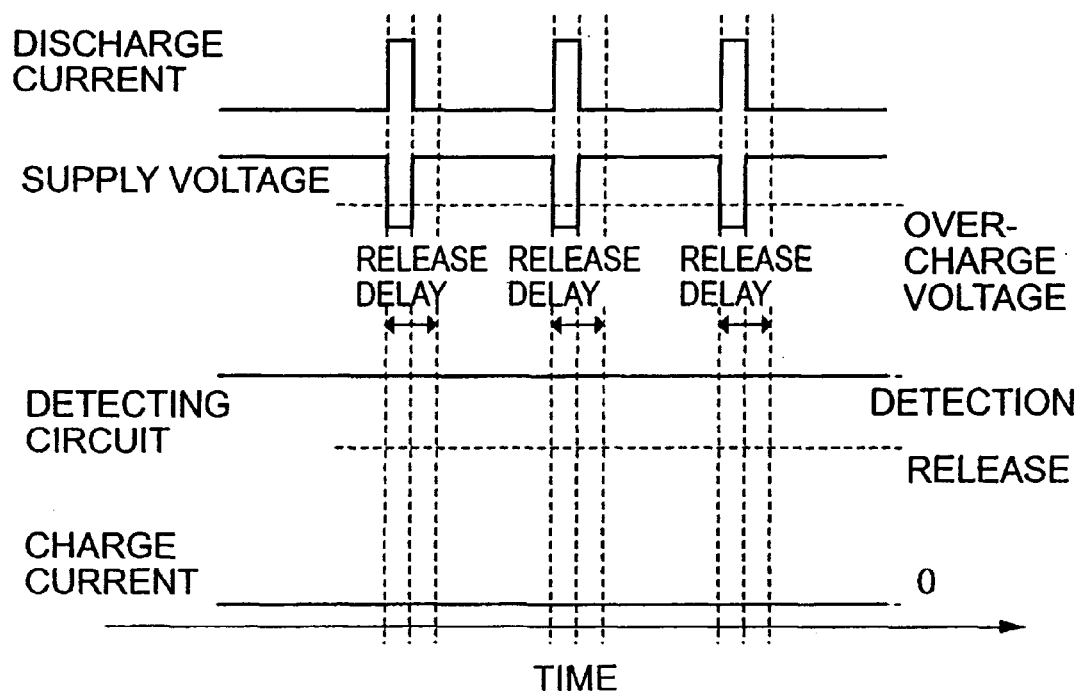
FIG. 10 is a timing chart in the case where pulsed discharging operation occurs while charging is being made in the battery state monitoring circuit and the battery device in accordance with the present invention.
Figure 11:
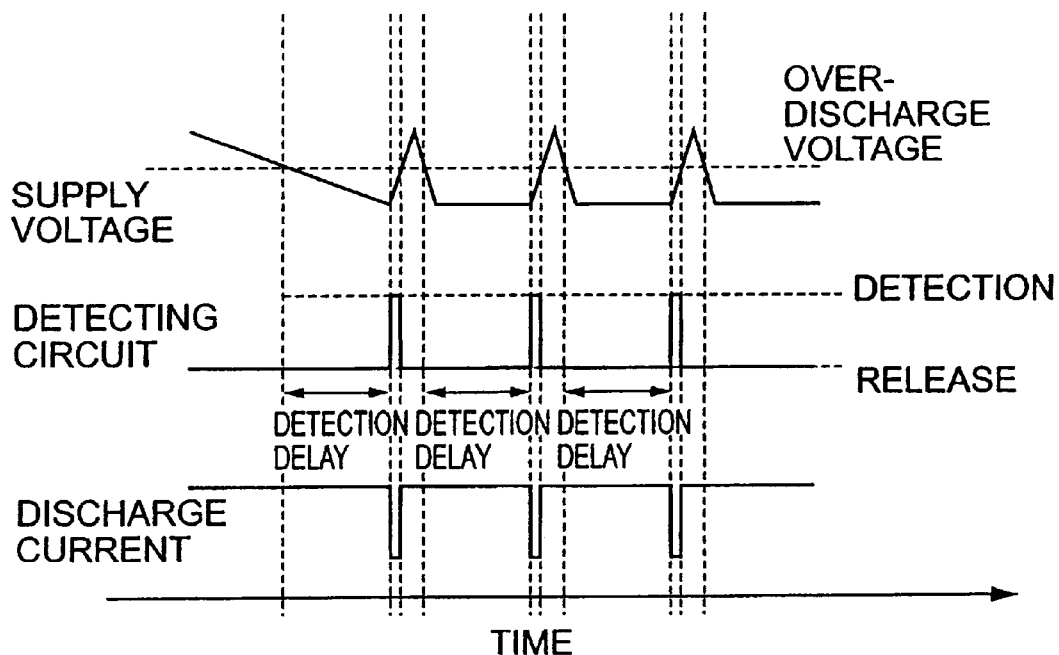
FIG. 11 is a timing chart at a moment where an over-discharge protective state is entered in the battery state monitoring circuit and the battery device in the prior art.

In the present invention, in the case where pulsed discharge operation occurs during charging, as shown in a timing chart of FIG. 10, a voltage drops in an internal impedance of the secondary battery 201 as soon as the discharge occurs. However, even if the voltage is lower than a given voltage which should be subjected to over-charge protection by the above voltage drop, if the delay-time of the delay circuit 109 is set to the above pulse time or longer, the battery state monitoring circuit 102 maintains the over-charge protective state. For that reason, if the voltage of the secondary battery 201 rises due to the charging operation, the battery device continues in the over-charge protective state until the battery reaches a given voltage for an extended period of time, thereby providing a safe battery device in which the battery does not overheat or explode.

Conversely, in the battery state monitoring circuit and the battery device shown FIG. 1, when a charger 301 is connected between the external terminals +V0 204 and −V0 205 of the battery device which IS in an over-discharge protective state, and the secondary battery 201 is not less than a lower limit value of the discharge voltage, an over-discharge release signal is outputted to the delay circuit 310 from the over-discharge detecting circuit 307. Because the delay circuit 310 is a delay circuit of an over-discharge detection signal as in the conventional example, the over-discharge release signal is outputted to the delay circuit 110 without any delay. The delay circuit 110 outputs the over-discharge release signal to the logic circuit 305 when the over-discharge release signal continues for a given period of time. If the over-discharge release signal is inputted to the logic circuit 305, the logic circuit 305 outputs a discharge enable signal to an FET-A 304, to enable the discharge operation.

Figure 12:
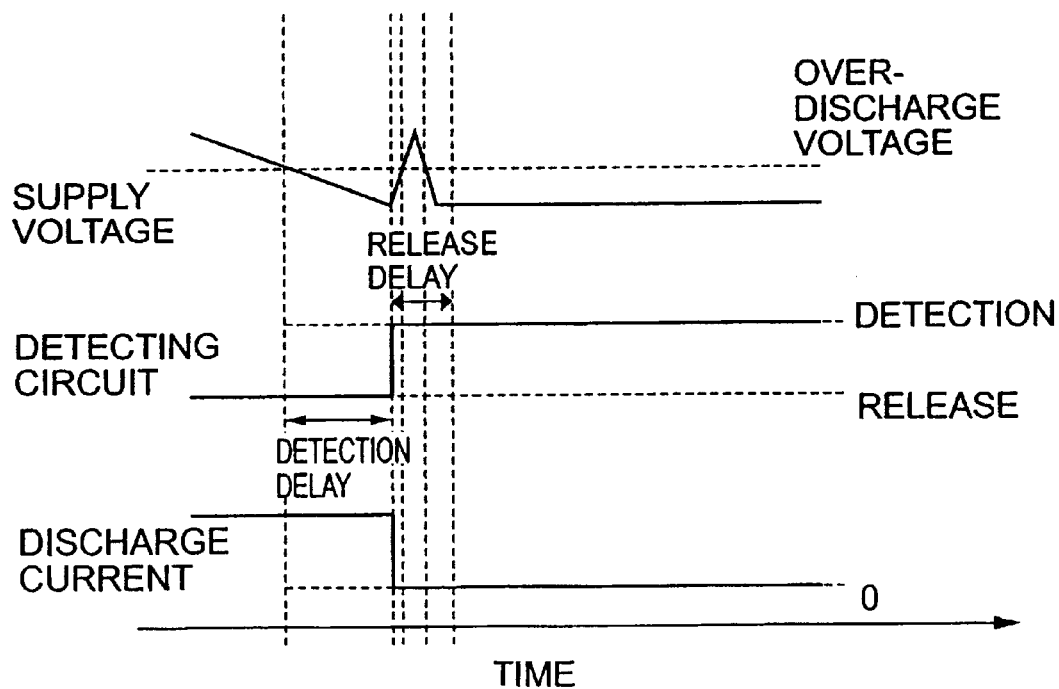
FIG. 12 is a timing chart at a moment where an over-discharge protective state is entered in the battery state monitoring circuit and the battery device in accordance with the present invention.

In the present invention, as shown in a timing chart of FIG. 12, when a discharge current stops as soon as the over-discharge protective state is entered, the battery voltage temporarily rises due to the parasitic coil component of the secondary battery 201 or the like. However, even if the voltage exceeds a given voltage which should be subjected to over-discharge protection due to the temporal voltage rising, if the delay time of the delay circuit 110 is set to a period of time during which the above temporal voltage rising is suppressed or longer, the battery state monitoring circuit 102 maintains the over-discharge protective state. For that reason, if the voltage of the secondary battery 201 drops due to the discharge operation, the over-discharge protective state continues until reaching a given voltage, thereby providing a battery device having a battery whose lifetime is not degraded.

Also, in the battery state monitoring circuit and the battery device shown in FIG. 1, when the load 302 connected between the external terminals +V0 204 and −V0 205 of the battery device which is in an over-current protective state is disconnected from those external terminals to stop a discharge current, and the potential of the external terminal −V0 205 decreases to not greater than a given value, an over-current release signal is outputted to the delay circuit 311 from the overcurrent detecting circuit 308. Because the delay circuit 311 is a delay circuit of an over-current detection signal as in the conventional example, the delay circuit 311 outputs an over-current release signal to the delay circuit 111 without any delay. The delay circuit 111 outputs the over-current release signal to the logic circuit 305 if the over-current release signal continues for a given period of time or longer. If the over-current release signal is inputted to the logic circuit 305, the logic circuit 305 outputs the discharge enable signal to the FET-A 304, to thereby enable the discharge operation.

In the present invention, when the discharge current stops as soon as the over-current protective state is entered, the voltage of −V0 205 temporarily drops due to the coil component of the external load or the like. However, even if the voltage is temporarily lower than the given voltage which should be subjected to the over-current protection, if the delay time of the delay circuit 111 is set to a period of time during which the above temporal voltage drop is suppressed or longer, the battery state monitoring circuit 102 maintains the over-current protective state. The operation principle is the same as that in case of the over-discharge state. For that reason, the over-current protective state continues until a given current is reached, thereby providing a battery device having a switch circuit 203 without a degraded the lifetime.

Figure 4:
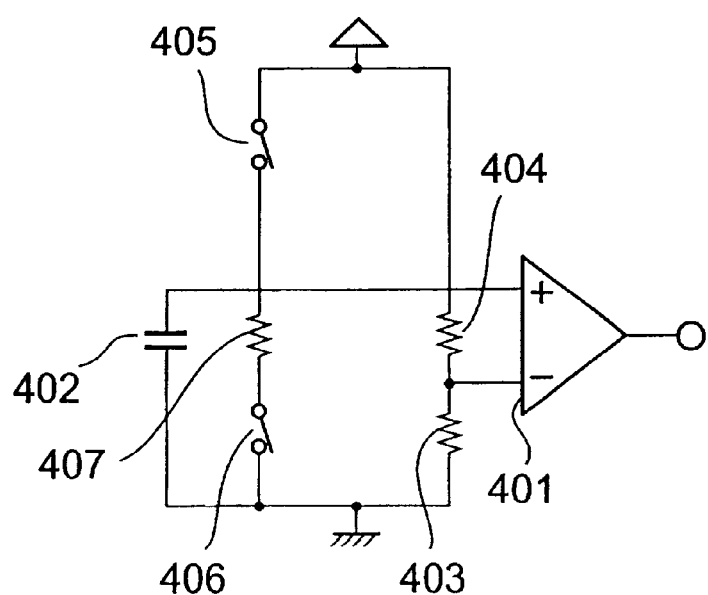
FIG. 4 is a circuit block diagram showing an example of a delay circuit 109 used in the present invention.

FIG. 4 is a circuit block diagram showing an example of a delay circuit 109 used in the present invention. The delay circuit 109 shown in FIG. 4 includes a comparator 401, a capacitor 402, resistors 403, 404, 407, and switches 405, 406. The switches 405 and 406 are structured such that only one of those switches 405 and 406 conducts at specific points in time. In this example, it is assumed that the over-charge detection signal is VDD, and the over-charge release signal is VSS. The switch 405 turns on in response to the over-charge detection signal, charges the capacitor 402 and allows the voltage of the plus terminal of the capacitor 402 to rise up to VDD. When the voltage of the plus terminal of the capacitor 402 (connected with the non-inverting input of the comparator 401) becomes higher than a voltage divided by the resistors 403 and 404, the output of the comparator 401 is inverted from VSS to VDD to output the over-charge detection signal. At this time, no delay occurs in the over-charge detection signal. Conversely, the switch 406 turns on in response to the over-charge release signal, discharges the capacitor 402 through the resistor 407 and decreases the voltage of the plus terminal of the capacitor 402 down to VSS. When the voltage of the plus terminal of the capacitor 402 becomes lower than the voltage divided by the resistors 403 and 404, the output of the comparator 401 is inverted from VDD to VSS to output the over-charge release signal. At this time, a delay occurs in the over-charge release signal in correspondence with the capacitor 402 and the resistor 407. The delay circuit 109 can be structured by a simple circuit as described above.

Figure 7:
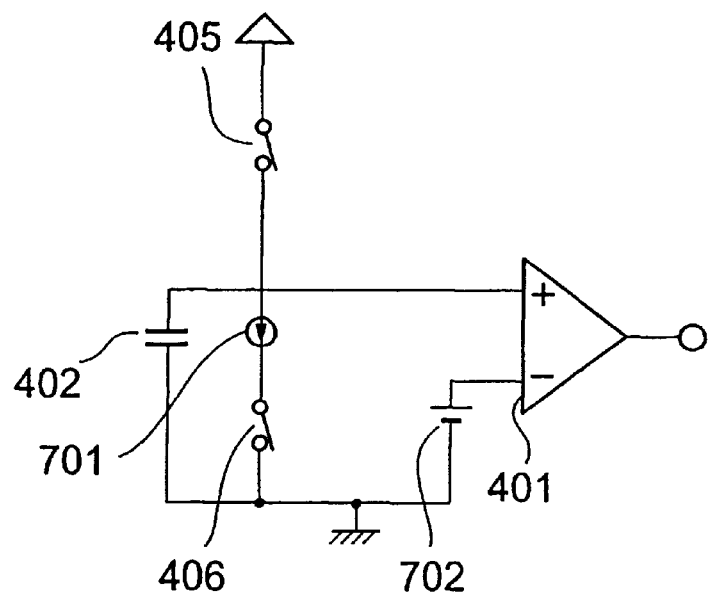
FIG. 7 is a circuit block diagram showing another example of the delay circuit 109 used in the present invention.

FIG. 7 is a circuit block diagram showing another example of the delay circuit 109 used in the present invention. The delay circuit 109 shown in FIG. 7 charges the capacitor similar to the delay circuit shown in FIG. 4. However, the delay circuit 109 in FIG. 7 discharges the capacitor 402 using a constant current source 701 that outputs a constant current to produce a delay. The delay circuit 109 in FIG. 7 compares the voltage at the plus terminal of the capacitor 402 with a reference voltage 702 that outputs a constant voltage to invert the output (i.e. the reference voltage 702 is supplied to the inverting terminal of the comparator 401), thus realizing a similar delay operation as that in FIG. 4. The capacitor 402, the resistor 407 and the constant current source 701 may be constant or adjustable, in the latter case, the delay circuit 109 can realize an arbitrary delay time.

Although the structural elements that comprise the delay circuit 109, such as the capacitor 402, are illustrated as integrated components, it is also possible that these elements may be external parts of the battery state monitoring circuit. Also, the delay circuits 110 and 111 can be structured with the same circuit of the delay circuit 109or the delay circuits 109, 110 and 111 can be structured in various manners without being limited to the above embodiment to realize a signal delay.

Figure 8:
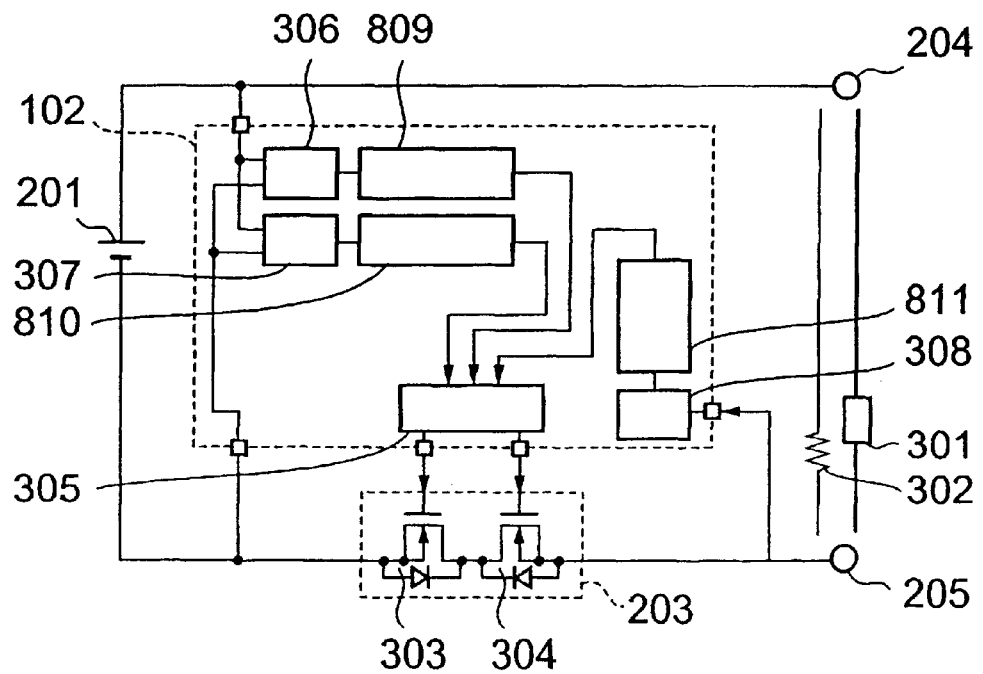
FIG. 8 is circuit block diagram showing a battery state monitoring circuit and a battery device in accordance with another embodiment of the present invention.
Figure 9:
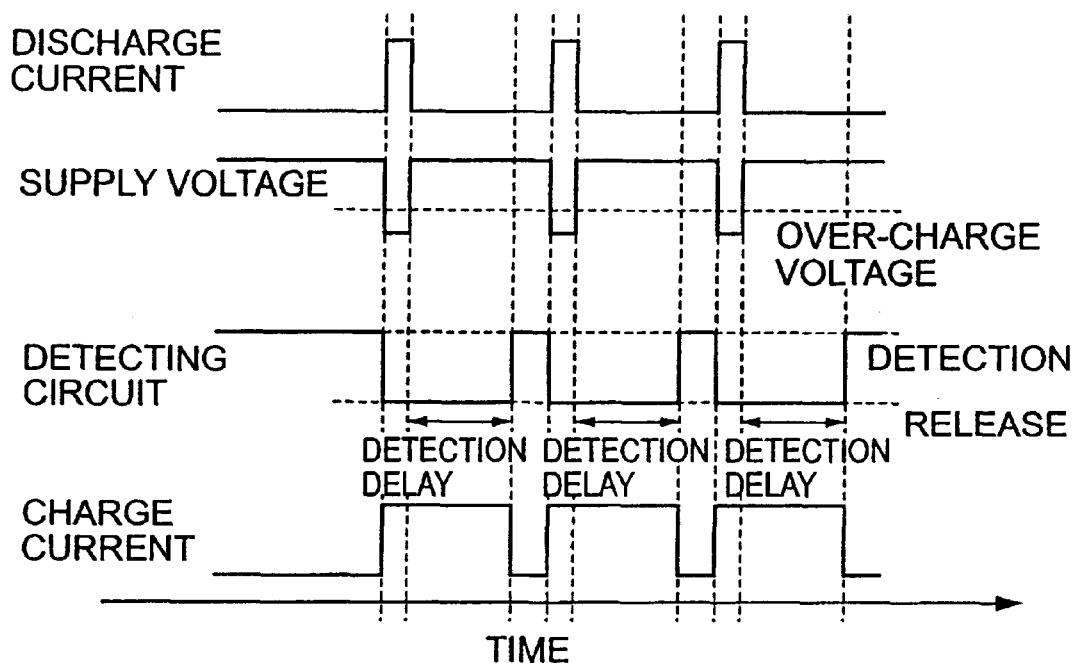
FIG. 9 is a timing chart in the case where pulsed discharging operation occurs while charging is being made in the battery state monitoring circuit and the battery device in the prior art.

FIG. 8 is a circuit block diagram showing a battery state monitoring circuit and a battery device in accordance with another embodiment of the present invention. The battery state monitoring circuit shown in FIG. 8 is provides detection release delay circuits 809, 810 and 811 instead of the detection delay circuits 309, 310, 311 and the release delay circuits 109, 110 and 111 of the battery state monitoring circuit shown in FIG. 1. The operation of the battery state monitoring circuit 102 and the effect of the invention are identical with those in FIG. 1.

Figure 5:
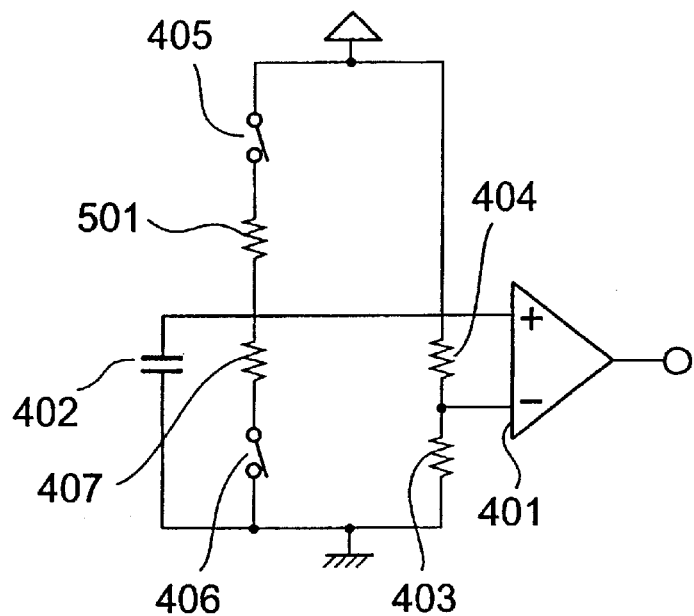
FIG. 5 is a circuit block diagram showing an example of a delay circuit 809 used in the present invention.

FIG. 5 is a circuit block diagram showing an example of a delay circuit 809 used in the present invention. FIG. 5 shows the circuit shown in FIG. 4 having an additional resistor 501. The one end of the additional resistor 501 is connected with the switch 405 and the other end is connected with the discharge resistor 407, the capacitor 402, the resistor 404, and the non-inverting input terminal of the comparator 401. With this structure, a delay can be provided in both of the over-charge release signal and over-charge detection signal.

Figure 6:
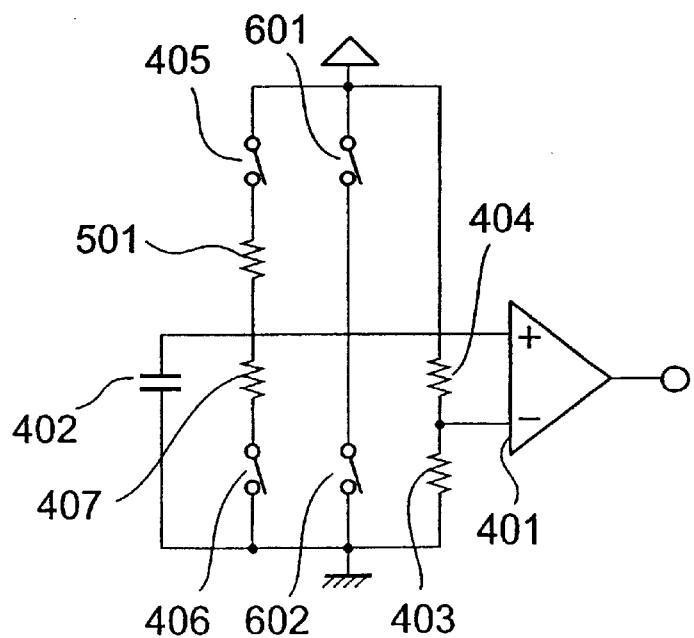
FIG. 6 is a circuit block diagram showing another example of the delay circuit 809 used in the present invention.

FIG. 6 is a circuit block diagram showing another example of the delay circuit 809 used in the present invention. The delay circuit of FIG. 6 has switches 601 and 602 added to the circuit shown in FIG. 5. The switches 601 and 602 are connected between VDD and VSS, with the connection point between the switches 601 and 602 being connected with the additional resistor 501, the discharge resistor 407, the capacitor 402, the resistor 404, and the non-inverting input terminal of the comparator 401. Only one of the switches 601 and 602 is conductive at a particular time. The switch 601 turns on when the switch 405 turns on and the over-charge detection signal is outputted from the comparator 401, as a result of which the plus terminal voltage of the capacitor 402 rises to VDD. The switch 602 turns on when the switch 406 turns on and the over-charge release signal is outputted from the comparator 401, as a result of which the plus terminal voltage of the capacitor 402 drops to VSS. In FIG. 6, because the start voltage of the CR delay is fixed to VDD or VSS, a more accurate delay time can be obtained. For example, this structure is very effective in the case where detection and release alternately occur in a short period of time.

Also, in the present invention, when the circuit structures shown in FIGS. 5 and 6 are used, the state of the battery state monitoring circuit 102 can be simply determined by monitoring the plus terminal voltage of the capacitor 402 such that the battery device is in the over-charge detection state if the plus terminal voltage of the capacitor 402 is VDD, conversely the battery device is in the over-charge release state if the plus terminal voltage of the capacitor 402 is VSS, and the battery device is in a delay time if the plus terminal voltage of the capacitor 402 is between VDD and VSS.

Also, the delay circuits 810 and 811 can be structured with the same circuit as the circuit 809 and to provide the same effects. Further, the delay circuits 809, 810 and 811 can be structured in various manners without being limited to this embodiment to realize a signal delay.

As was described above, in the battery state monitoring circuit and the battery device according to the present invention, it is possible to ensure both of the detection delay when the respective protective states of the over-charge, the over-discharge and the over-current are entered, and the release delay when the battery device is released from the protective states. With this structure, even if pulsed discharge occurs while charging is occurring, the battery state monitoring circuit can maintain the over-charge protective state, thereby being capable of providing a battery device with high safety.

Also, even if the discharge current stops as soon as the battery device enters the over-discharge protective state, the battery state monitoring circuit can maintain the over-discharge protective state, thereby providing a battery device with long battery lifetime.

Further, even if the discharge current stops as soon as the battery device enters the over-current protective state, the battery state monitoring circuit can maintain the over-current protective state, thereby providing a battery device with a switch circuit having a long lifetime.

Still further, since the voltage of the capacity terminal of the delay circuit is monitored, the states of the battery state monitoring circuit and the battery device can be easily determined.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto and their equivalents.

What is claimed is:

1. A battery state monitoring circuit for a secondary battery having a voltage comprising:
    a detecting circuit to detect an upper limit voltage to which the secondary battery is charged; and
    a signal delay circuit that delays, for an arbitrary time, both of a detection signal outputted by said detecting circuit when the voltage of the secondary battery exceeds the upper limit voltage and a release signal outputted by said detecting circuit when the voltage of the secondary battery is lower than the upper limit voltage.

2. A battery state monitoring circuit for a secondary battery having a voltage comprising:
    a detecting circuit to detect a lower limit voltage to which the secondary battery is discharged; and
    a signal delay circuit that delays, for an arbitrary time, both of a detection signal outputted by said detecting circuit when the voltage of the secondary battery is lower than the lower limit voltage and a release signal outputted by said detecting circuit when the voltage of the secondary battery exceeds the lower limit voltage.

3. A battery state monitoring circuit for a secondary battery comprising:
    a current limiter through which current flows;
    a detecting circuit to detect an upper limit current that flows in said current limiter; and
    a signal delay circuit that delays, for an arbitrary time, both of a detection signal outputted by said detecting circuit when the current flowing in the current limiter exceeds the upper limit current and a release signal outputted by said detecting circuit when the current flowing in the current limiter is lower than the upper limit current.

4. A battery state monitoring circuit for a secondary battery having a voltage comprising:
    a first detecting circuit to detect an upper limit voltage to which the secondary battery is charged;
    a first signal delay circuit that delays, for an arbitrary time, both of a first detection signal outputted by said first detecting circuit when the voltage of the secondary battery exceeds the upper limit voltage and a first release signal outputted by said first detecting circuit when the voltage of the secondary battery is lower than the upper limit voltage;
    a second detecting circuit to a lower limit voltage to which the secondary battery is discharged;
    a second signal delay circuit that delays, for an arbitrary time, both of a second detection signal outputted by said second detecting circuit when the voltage of the secondary battery is lower than the lower limit voltage and a second release signal outputted by said second detecting circuit when the voltage of the secondary battery exceeds the lower limit voltage;
    a current limiter through which current flows;
    a third detecting circuit to detect an upper limit current that flows in said current limiter; and
    a third signal delay circuit that delays, for an arbitrary time, both of a third detection signal outputted by said third detecting circuit when the current flowing in the current limiter exceeds the upper limit current and a third release signal outputted by said third detecting circuit when the current flowing in the current limiter is lower than the upper limit current.

5. A battery state monitoring circuit as claimed in claim 1, wherein said signal delay circuit adjusts at least one of a delay time of the detection signal and a delay time of the release signal.

6. A battery state monitoring circuit as claimed in claim 1, wherein a part of said signal delay circuit is monitored to determine a battery state of the secondary battery.

7. A battery device having a secondary battery that enables charge and discharge, a current limiter that adjusts a current of the secondary battery, and a battery state monitoring circuit that controls said current limiter and monitors at least one of a voltage and a current of the secondary battery between external plus and minus terminals of the battery state monitoring circuit; wherein said battery state monitoring circuit comprises the battery state monitoring circuit according to claim 1.

8. A battery device having a secondary battery that enables charge and discharge, a current limiter that adjusts a current of the secondary battery, and a battery state monitoring circuit that controls said current limiter and monitors at least one of a voltage and a current of the secondary battery between external plus and minus terminals of the battery state monitoring circuit; wherein said battery state monitoring circuit comprises the battery state monitoring circuit according to claim 2.

9. A battery device having a secondary battery that enables charge and discharge, a current limiter that adjusts a current of the secondary battery, and a battery state monitoring circuit that controls said current limiter and monitors at least one of a voltage and a current of the secondary battery between external plus and minus terminals of the battery state monitoring circuit; wherein said battery state monitoring circuit comprises the battery state monitoring circuit according to claim 3.

10. A battery device having a secondary battery that enables charge and discharge, a current limiter that adjusts a current of the secondary battery, and a battery state monitoring circuit that controls said current limiter and monitors at least one of a voltage and a current of the secondary battery between external plus and minus terminals of the battery state monitoring circuit; wherein said battery state monitoring circuit comprises the battery state monitoring circuit according to claim 4.

11. A battery device having a secondary battery that enables charge and discharge, a current limiter that adjusts a current of the secondary battery, and a battery state monitoring circuit that controls said current limiter and monitors at least one of a voltage and a current of the secondary battery between external plus and minus terminals of the battery state monitoring circuit; wherein said battery state monitoring circuit comprises the battery state monitoring circuit according to claim 5.

12. A battery device having a secondary battery that enables charge and discharge, a current limiter that adjusts a current of the secondary battery, and a battery state monitoring circuit that controls said current limiter and monitors at least one of a voltage and a current of the secondary battery between external plus and minus terminals of the battery state monitoring circuit; wherein said battery state monitoring circuit comprises the battery state monitoring circuit according to claim 6.

\* \* \* \* \*

UNITED STATES PATENT AND TRADEMARK OFFICE
CERTIFICATE OF CORRECTION

PATENT NO.    : 6,437,541 B1
DATED         : August 20, 2002
INVENTOR(S)   : Atsushi Sakurai It is certified that error appears in the above-identified patent and that said Letters Patent is hereby corrected as shown below:

<u>Title page,</u>
Item [73], delete "Tokyo" and substitute -- Chiba -- in its place.

Signed and Sealed this

Tenth Day of June, 2003

JAMES E. ROGAN
*Director of the United States Patent and Trademark Office*